US012275319B2

(12) United States Patent
Heyne et al.

(10) Patent No.: US 12,275,319 B2
(45) Date of Patent: Apr. 15, 2025

(54) COOLING TANK INSTALLATION FOR A LIQUID COOLING OF A CHARGING STATION FOR ELECTRICALLY POWERED MOTOR VEHICLES

(71) Applicants: Dr. Ing. h.c. F. Porsche Aktiengesellschaft, Stuttgart (DE); ads-tec Energy GmbH, Nürtingen (DE)

(72) Inventors: Raoul Heyne, Wiernsheim (DE); Matthias Bohner, Stuttgart (DE); Thomas Speidel, Markgröningen (DE)

(73) Assignees: Dr. Ing. h. c. F. Porsche AG, Stuttgart (DE); ads-tec Energy GmbH, Neurtingen (DE)

( * ) Notice: Subject to any disclaimer, the term of this patent is extended or adjusted under 35 U.S.C. 154(b) by 545 days.

(21) Appl. No.: 17/497,095

(22) Filed: Oct. 8, 2021

(65) Prior Publication Data
US 2022/0111746 A1    Apr. 14, 2022

(30) Foreign Application Priority Data
Oct. 8, 2020 (DE) ............. 10 2020 126 413.5

(51) Int. Cl.
*H02J 7/00* (2006.01)
*B60L 53/18* (2019.01)
(Continued)

(52) U.S. Cl.
CPC ............ *B60L 53/302* (2019.02); *B60L 53/18* (2019.02); *H05K 7/20927* (2013.01)

(58) Field of Classification Search
CPC .... B60L 53/302; B60L 53/18; H05K 7/20927
(Continued)

(56) References Cited

U.S. PATENT DOCUMENTS 3,420,363 A * 1/1969 Blickensderfer .. B65D 81/1275
264/230
4,782,670 A * 11/1988 Long ........................ F25D 3/08
62/530
(Continued)

FOREIGN PATENT DOCUMENTS

| CA | 2321808 | 3/2001 |
| DE | 102017217879 | 4/2019 |
| WO | 9639561 | 12/1996 |

OTHER PUBLICATIONS

European Search Report dated Mar. 1, 2022.

*Primary Examiner* — Alexis B Pacheco
(74) *Attorney, Agent, or Firm* — Gerald E. Hespos; Michael J Porco

(57) ABSTRACT

A cooling tank installation (10) for a liquid cooling of a charging station for electrically powered motor vehicles includes at least one reservoir (12, 14) for receiving an environmentally hazardous cooling medium. The reservoir (12, 14) is inserted in a retention vessel (16) for retaining a quantity of leakage from the reservoir (12, 14), and a receiving volume for receiving the entire liquid volume of the reservoir (12, 14) is formed between the reservoir (12, 14) and the retention vessel (16). The retention vessel (16) is inserted in an outer vessel (20) that provides support with respect to earth loads. An absorption body (24) is provided in the outer vessel (20) between the retention vessel (16) and the outer vessel (20) in the direction of gravity for absorbing moisture, and a moisture sensor detects moisture of the absorption body (24).

10 Claims, 1 Drawing Sheet

(51) Int. Cl.
*B60L 53/302* (2019.01)
*H02J 7/14* (2006.01)
*H05K 7/20* (2006.01)

(58) Field of Classification Search
USPC .......................................................... 320/109
See application file for complete search history.

(56) References Cited

U.S. PATENT DOCUMENTS

| | | | | | |
|---|---|---|---|---|---|
| 4,884,709 | A | * | 12/1989 | McCarthy | B65D 90/105 220/567.1 |
| 4,911,326 | A | * | 3/1990 | McGouran, Jr. | B65D 88/76 73/49.3 |
| 4,951,844 | A | * | 8/1990 | Sharp | B65D 90/503 220/592.2 |
| 5,033,638 | A | * | 7/1991 | Cruver | B65D 90/24 220/571 |
| 5,081,761 | A | * | 1/1992 | Rinehart | B65D 90/028 220/560.12 |
| 5,450,948 | A | * | 9/1995 | Beausoleil | B65D 81/3813 53/472 |
| 5,877,932 | A | * | 3/1999 | Hauck | B65D 90/507 361/215 |
| 6,135,273 | A | * | 10/2000 | Cuen | B65D 81/264 206/545 |
| 6,396,241 | B1 | * | 5/2002 | Ramos | B60L 53/11 320/108 |
| 10,923,785 | B2 | | 2/2021 | Heyne et al. | |
| 2004/0103955 | A1 | * | 6/2004 | Awad | F01P 11/0276 141/98 |
| 2013/0241479 | A1 | * | 9/2013 | Wright, Jr. | H02J 7/0029 141/94 |
| 2015/0306974 | A1 | * | 10/2015 | Mardall | H01M 10/625 429/120 |
| 2017/0071381 | A1 | * | 3/2017 | Ze | B65D 81/3844 |
| 2017/0366024 | A1 | * | 12/2017 | Chen | B60L 53/305 |

* cited by examiner

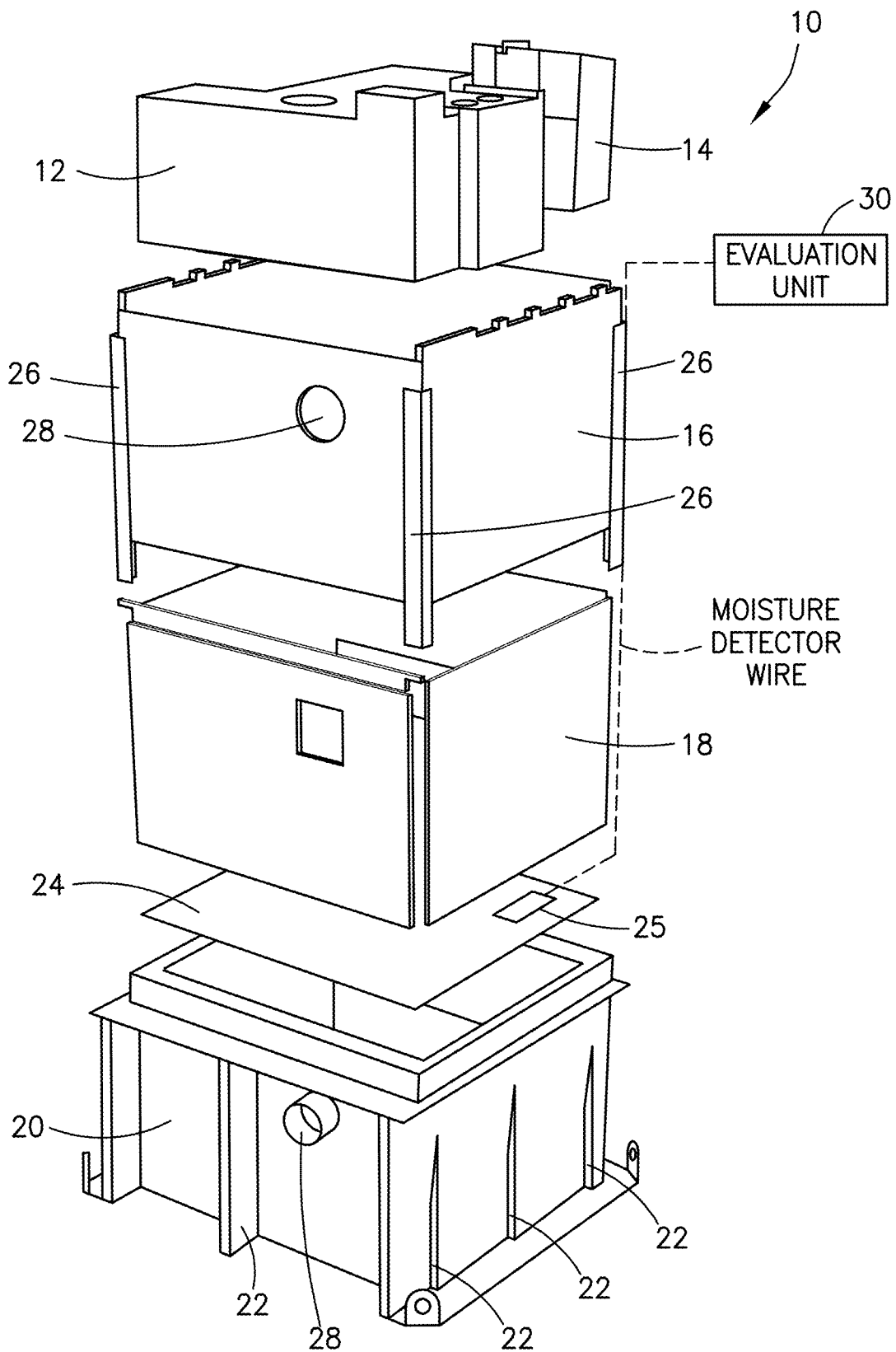

COOLING TANK INSTALLATION FOR A LIQUID COOLING OF A CHARGING STATION FOR ELECTRICALLY POWERED MOTOR VEHICLES

CROSS REFERENCE TO RELATED APPLICATION

This application claims priority under 35 USC 119 to German Patent Appl. No. 10 2020 126 413.5 filed on Oct. 8, 2020, the entire disclosure of which is incorporated herein by reference.

BACKGROUND

Field of the Invention. The invention relates to a cooling tank installation for underground storage of a liquid cooling medium intended for a liquid cooling of a charging station for electrically powered motor vehicles.

Related Art. DE 10 2017 217 879 A1 discloses a charging station for charging an electrically powered motor vehicle. The power electronics of the charging station can be cooled with the aid of underground liquid cooling.

There is a constant need for a charging station for electrically powered motor vehicles to be cooled well, without harming the environment.

An object of the invention is to environmentally safe cooling of a charging station for electrically powered motor vehicles.

SUMMARY

One embodiment concerns a cooling tank installation for a liquid cooling of a charging station for electrically powered motor vehicles. The cooling tank installation comprises at least one reservoir for receiving an environmentally hazardous cooling medium. A retention vessel is provided for retaining leakage from the reservoir, and the reservoir is inserted in the retention vessel. Thus, a receiving volume is formed between the reservoir and the retention vessel and can receive the entire liquid volume of the reservoir. The retention vessel is inserted in an outer vessel that provides support with respect to earth loads. An absorption body may be provided between the retention vessel and the outer vessel in the direction of gravity and can absorb moisture. A moisture sensor may be provided for detecting moisture of the absorption body. The moisture sensor may be one of the many commercially available moisture or liquid sensors. The absorption body may be a textile nonwoven and can absorb moisture or liquid entering the outer vessel. The moisture sensor can measure moisture accumulated at a defined location. Thus, it is possible to detect leakage from outside through the outer vessel and leakage from the retention vessel into the outer vessel. This obviates the need for raised mounting of the retention vessel in a concrete wall.

Moisture occurring in the intermediate space between the retention vessel and the outer vessel because of a leakage can be concentrated in the absorption body. Accordingly, there is no need for visual inspection of the inner wall of the outer vessel and the outer wall of the retention vessel. A very small leak may not be visually distinguishable from water that has condensed out of atmospheric moisture but can be detected by accumulation in the absorption body.

An evaluation unit is connected to the moisture sensor in some embodiments to measure the variation of the detected moisture in the absorption body over time and to establish the existence of a leakage with certainty. Additionally, a leakage from the reservoir can be retained completely by the retention vessel. More particularly, the retention vessel has three walls to provide double-walled protection for the environment from the cooling medium. As a result, a leakage can be detected quickly and reliably and can be retained long enough to allow a repair to be carried out. In this regard, repair of a leak in a cooling tank that is installed underground can take some time. However, the outer vessel and the monitoring of the moisture in the outer vessel, as described herein, can provide a further safety measure against the cooling medium escaping into the surroundings, and a particular urgency for carrying out a repair can be recognized.

In the context of this disclosure, an "evaluation unit" can be understood to include, for example, a processor and/or a storage unit or memory for storing algorithms and program commands. By way of example, the processor and/or the evaluation unit is specifically configured to carry out program commands in such a way that the processor and/or the evaluation unit carries out functions to implement or realize a method as disclosed herein or a step of a method as disclosed herein. The term evaluation unit is used here synonymously with devices known from the prior art. An evaluation unit, therefore, encompasses a "computer" and accordingly comprises one or more general-purpose processors (CPUs) or microprocessors, RISC processors, GPUs and/or DSPs. The evaluation unit or computer has for example additional elements such as storage interfaces of communication interfaces. Optionally or additionally, the terms "evaluation unit" and "computer" refer to a device that is capable of executing a provided or included program, preferably with standardized programming language (for example C++, JavaScript or Python), and/or of controlling and/or accessing data storage devices and/or other devices such as input interfaces and output interfaces. The term evaluation unit also refers to a multiplicity of processors or a multiplicity of (sub)computers that are interconnected and/or connected and/or otherwise communicatively connected and possibly share one or more other resources, such as for example a memory.

This disclosure permits an underground storage of a large volume of a cooling medium that provides good cooling but is environmentally hazardous, in particular hazardous to water. For example, a water/glycol mixture of, for example over 220 liters, can be stored in the cooling tank installation without the cooling medium endangering the environment. Monitoring the moisture in the intermediate space between the retention vessel and the outer vessel allows a particular urgency for a repair to be recognized in good time before the environment is contaminated by the cooling medium, and so environmentally safer, good cooling of a charging station for electrically powered motor vehicles is made possible.

The cooling tank installation may be provided at least largely underground by burying the cooling tank installation in the ground. The outer vessel is designed and shaped so that the loads pressing on the outer vessel from the earth can be supported and do not have to be supported by the retention vessel. Thus, unnecessary loading that could damage the wall of the retention vessel is avoided.

The outer vessel and the retention vessel may be produced from a steel sealed by welding.

A first reservoir for cooled cooling medium and a separate second reservoir for a heated cooling medium may be provided, so that the components of the charging station can be adjusted to a desired operating temperature. An insulating material for thermal insulation and/or liquid-tight sealing may be provided between the at least one reservoir and the retention vessel and/or between the retention vessel and the outer vessel. The receiving volume formed between the at least one reservoir and the retention vessel may correspond at least to the sum of all the internal volumes of the reservoirs so that the entire installed volume of all of the cooling media can be received by the retention vessel. The volume of the intermediate space between the retention vessel and the outer vessel in some embodiments corresponds at least to the sum of all of the internal volumes of the reservoirs. Therefore, the entire installed volume of all the cooling media can be received by the outer vessel in the event that the retention vessel also develops a leak.

The absorption body is at a lowest point in the direction of gravity of an interior space of the outer vessel and/or over an entire bottom surface area of the outer vessel. As a result, moisture in the intermediate space between the retention vessel and the outer vessel can reach the absorption body due to gravity, and the entire moisture in the intermediate space can be measured quickly by the moisture sensor.

The outer vessel of some embodiments is produced from a steel and may have stiffening ribs for providing support with respect to earth loads. The stiffening ribs allow the outer vessel to be sufficiently stable to avoid the need for an outer concrete shell in which the cooling tank installation is mounted in a raised manner. Instead, the cooling tank installation can come into direct contact with the surrounding earth by way of the stiffened outer vessel, without risking contamination of the surroundings by escaping cooling medium.

A viewing tube may be led out from the outer vessel for visual examination of the absorption body and/or the outer vessel and/or the retention vessel. The viewing tube may reach the absorption body. The moisture sensor may be led to the absorption body through the viewing tube. The viewing tube allows an endoscope or other examining means to be introduced into the intermediate space between the retention vessel and the outer vessel and enables a visual inspection of the absorption body or other inspections. The viewing tube also may be used to position the moisture sensor that is provided for measuring the moisture in the absorption body. As a result, the moisture sensor easily can be withdrawn outward through the viewing tube and away from the absorption body for inspection and for maintenance, and can be brought back into its original position by way of the viewing tube. This improves the ease of maintenance and inspection. The viewing tube may be designed as one piece. Alternatively, the viewing tube may be of a multipart form, for example by part of the opening cross section of the viewing tube may be formed by an open channel that is placed on an outer side of the retention vessel. Thus, the part of the outer side of the retention vessel that is covered by the channel delimits the remaining opening cross section of the viewing tube. As a result, the use of material and the requirement for installation space for the viewing tube can be kept down.

The reservoir of some embodiments has a filling-level sensor for detecting a filling level of the cooling medium in the reservoir. The filling-level sensor may be connected to an evaluation unit for comparison of the filling level measured by the filling-level sensor with a filling level to be expected without leakage. If the measured filling level is much lower than the expected filling level, this may indicate the existence of a leakage. The evaluation unit may then initiate maintenance, for example by the evaluation unit causing a corresponding warning to be issued to an external service center. As a result, maintenance can be initiated at an early time, before a leakage in the retention vessel or in the outer vessel is detected.

A further moisture sensor and/or a further filling-level sensor may be provided in the retention vessel for detecting a leakage from the reservoir into the retention vessel is provided. Detecting too much liquid in the retention vessel may indicate the existence of a leak. An evaluation unit connected to the further moisture sensor and/or to the further filling-level sensor may then initiate maintenance, for example by causing a corresponding warning to be issued to an external service center. If at the same time no moisture is detected in the absorption body in the intermediate space between the retention vessel and the outer vessel, it is possible that the moisture detected in the retention vessel is only caused by a leakage of the reservoir. A further absorption body may be provided in the retention vessel and may be designed and connected in a way analogous to the absorption body in the outer vessel.

A supply line for feeding cooling medium to at least one component to be cooled of the charging station and a return line for returning cooling medium coming from the component to be cooled may be provided with the reservoir. A venting valve may be provided to exclude the possibility of a hydraulic siphoning effect in the supply line and/or a check valve may be provided in the return line. The venting valve allows ambient pressure to be applied, and so a siphoning effect from the reservoir in a suction line can be avoided. The check valve allows automatic avoidance of a flow counter to the designated direction of flow out of the reservoir. The leakage of cooling medium by way of a damaged component of the charging station as a result of the hydrostatic siphoning effect can be avoided.

A double-walled media-carrying pipe may be led through the outer vessel and the retention vessel at a position above the absorption body in the direction of gravity. The media carrying pipe may be sealed off with respect to the outer vessel and the retention vessel by way of a sealing element, in particular an annular-space seal and/or a rubber pressing seal. Thus, the pipe can be provided underground while providing sufficient protection from leakage.

An evaluation unit may be connected to the moisture sensor for identifying and/or quantifying a leakage in the outer vessel and/or in the retention vessel. The pipe may have a leakage sensor for detecting a leakage in the pipe, and the leakage sensor may be connected to the evaluation unit for identifying and/or quantifying a leak in the pipe. As a result, the evaluation technology in the evaluation unit can be used not only for the outer vessel and/or the retention vessel, but also for the double-walled pipe, and so that the number of components can be kept down.

A further embodiment concerns a charging station for charging an electrically powered motor vehicle. The charging station may have a charging cable for establishing electrical contact of the motor vehicle with an electrical energy source, power electronics for controlling a charging operation and a liquid cooling device for adjusting the temperature of the charging cable and/or the power electronics. The liquid cooling device may have the above-described cooling tank installation for storing a cooling medium at least largely underground. Monitoring moisture in the intermediate space between the retention vessel and the outer vessel of the cooling tank installation allows a particular urgency for a repair measure to be recognized in good time before the environment is contaminated by the cooling medium. Thus, good cooling of a charging station for electrically powered motor vehicles is made possible in an environmentally safe manner.

One embodiment is described below with reference to the appended drawing. The features that presented below can represent an aspect of the invention both individually and together.

BRIEF DESCRIPTION OF THE DRAWINGS

FIG. 1 shows a schematic, perspective exploded representation of a cooling tank installation.

DETAILED DESCRIPTION

The cooling tank installation 10 represented in FIG. 1 can store a considerable quantity of a cooling medium to achieve a desired operating temperature of components in a charging station intended for charging electrically powered motor vehicles to. In particular, the power electronics that heat up during charging and/or a charging cable of the charging station may be cooled. For this purpose, the cooling tank installation 10 may have a reservoir 12, which can for example store between 220 liters and 1000 liters of a cooling medium. It is also possible to provide a further reservoir 14, in which a cooling medium at a different temperature is stored. Thus, the cooling medium in the reservoir 12 can be used for cooling and the cooling medium in the further reservoir 14 can be used for heating. The reservoirs 12, 14 are inserted in a retention vessel 16 that can catch and retain cooling medium escaping as leakage from the reservoirs 12, 14. For this purpose, a receiving volume large enough to receive the entire liquid volume of all the reservoirs 12, 14 is kept free between the reservoirs 12, 14 and the retention vessel 16. The volume of the reservoirs 12, 14 themselves up to an overflow edge may be included in this. The reservoirs 12, 14 and/or the retention vessel 16 may be surrounded by an insulating material 18 for thermal insulation and/or liquid-tight sealing. The reservoirs 12, 14 and the retention vessel 16 may be produced from a steel, while the reservoirs 12, 14 are preferably produced from a plastics material.

The retention vessel 16 may be inserted, in particular completely, together with the inserted reservoirs 12, 14 in an outer vessel 20 produced from a steel. The outer vessel 20 may be buried underground in the earth below the rest of the charging station. The outer vessel 20 has a number of stiffening ribs 22 so that the outer vessel 20 can bear the loads exerted by the surrounding earth. An absorption body 24 is inside the outer vessel 20 and may be a textile nonwoven that can absorb moisture entering from the surroundings and/or cooling fluid escaping as leakage from the retention vessel 16. The absorption body 24 is provided at least on the bottom, between the retention vessel 16 and the outer vessel 20 in the direction of gravity. The moisture accumulated in the absorption body 24 can be detected by a moisture sensor 25 and evaluated in an evaluation unit 30 to decide whether there is any damage to be repaired on the outer vessel 20 and/or the retention vessel 16. The moisture sensor may be fed by way of an upwardly protruding viewing tube 26, and so the moisture sensor can be easily checked and exchanged. An endoscope can also be inserted by way of the viewing tube 26 to carry out a visual inspection of the absorption body 24. In a further embodiment, the outer side of the retention vessel 16 and/or the inner side of the outer vessel 20 may be checked with the endoscope. Only a very narrow air gap between the retention vessel 16 and the outer vessel 20 is required for this purpose, and so a much smaller installation space requirement is achieved in comparison with raised mounting of the retention vessel 16 in a concrete shell, and this necessitates the excavation of correspondingly less earth to provide the cooling tank installation 10 underground.

If need be, the outer vessel 20 and/or the retention vessel 16 have a passage 28 for leading through a double-walled media-carrying pipe that is connected, for example, to a reservoir 12, 14 and leads underground to a further charging station or parts and/or components of the charging station. The pipe may be sealed off by way of annular-space seals with rubber pressing seals provided in the passages 28.

What is claimed is:

1. A cooling tank installation for a liquid cooling of a charging station for electrically powered motor vehicles, comprising:
   at least one reservoir (12, 14) having a plurality of reservoir walls defining an enclosed reservoir volume for receiving an environmentally hazardous liquid cooling medium;
   a retention vessel (16) having retention vessel walls defining a retention vessel volume, the reservoir (12, 14) being inserted in the retention vessel volume while leaving sufficient excess retention vessel volume between the at least one reservoir (12, 14) and the retention vessel (16) for receiving all of the cooling liquid from the at least one reservoir (12, 14);
   an outer vessel (20) for providing support for the cooling tank installation with respect to earth loads, the outer vessel (20) having outer vessel walls defining an outer vessel volume, the retention vessel (16) being inserted in the outer vessel volume of the outer vessel (20);
   an absorption body (24) for absorbing moisture being provided in the outer vessel volume of the outer vessel (20) between the retention vessel (16) and the outer vessel (20) in a direction of gravity;
   a moisture sensor disposed between the retention vessel (16) and the outer vessel (20) for detecting the moisture of the absorption body (24); and
   a viewing tube (26) between the outer vessel (20) and the retention vessel (16) and led out from the outer vessel (20) for visual examination of at least one of the absorption body (24), the outer vessel (20) and the retention vessel (16), the viewing tube (26) reaching the absorption body (24), a moisture detecting wire of the moisture sensor being led to the absorption body (24) through the viewing tube (26).

2. The cooling tank installation of claim 1, wherein the absorption body (24) is provided at a lowest point in the direction of gravity of an interior space of the outer vessel (20) and/or over an entire bottom surface area of the outer vessel (20).

3. The cooling tank installation of claim 1, wherein the outer vessel (20) is produced from a steel and has stiffening ribs (22) for providing support with respect to earth loads.

4. The cooling tank installation of claim 1, wherein the reservoir (12, 14) has a filling-level sensor for detecting a filling level of the cooling medium in the reservoir (12, 14), the filling-level sensor being connected to an evaluation unit for comparison of the filling level measured by the filling-level sensor with a filling level to be expected without leakage.

5. The cooling tank installation of claim 1, comprising a further moisture sensor and/or a further filling-level sensor provided in the retention vessel (16) for detecting a leakage from the reservoir (12, 14) into the retention vessel (16).

6. The cooling tank installation of claim 1, further comprising a double-walled media-carrying pipe provided above the absorption body (24) in the direction of gravity, and being led through the outer vessel (20) and the retention vessel (16), the double-walled media-carrying pipe being sealed off with respect to the outer vessel (20) and the retention vessel (16) by an annular-space seal and/or a rubber pressing seal.

7. The cooling tank installation of claim 6, further comprising an evaluation unit connected to the moisture sensor for identification and/or quantification of a leakage in the outer vessel (20) and/or in the retention vessel (16), the pipe having a leakage sensor for detecting a leakage in the pipe and the leakage sensor being connected to the evaluation unit for identification and/or quantification of a leak in the pipe.

8. A charging station for charging an electrically powered motor vehicle, comprising: a charging cable for establishing electrical contact of the motor vehicle with an electrical energy source; power electronics for controlling a charging operation and a liquid cooling device for adjusting the temperature of the charging cable and/or the power electronics, the liquid cooling device having the cooling tank installation (10) of claim 1, that is provided at least largely underground for storing a cooling medium.

9. The cooling tank installation of claim 1, further comprising a thermal insulation material (18) filling a space between the retention vessel (16) and the outer vessel (20).

10. The cooling tank installation of claim 1, wherein the at least one reservoir (12, 14) comprises a first reservoir (12) and a second reservoir (14) for receiving first and second environmentally hazardous liquid cooling media.

* * * * *